(12) United States Patent
Abe et al.

(10) Patent No.: US 10,836,575 B2
(45) Date of Patent: Nov. 17, 2020

(54) STORAGE RACK

(71) Applicant: Daifuku Co., Ltd., Osaka (JP)

(72) Inventors: Takeshi Abe, Hinocho (JP); Tadahiro Yoshimoto, Hinocho (JP); Naoyuki Yoshikawa, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 213 days.

(21) Appl. No.: 15/938,390

(22) Filed: Mar. 28, 2018

(65) Prior Publication Data

US 2018/0282060 A1    Oct. 4, 2018

(30) Foreign Application Priority Data

Mar. 29, 2017   (JP) .................................. 2017-065323

(51) Int. Cl.
| | |
|---|---|
| *H01L 21/673* | (2006.01) |
| *B65G 1/02* | (2006.01) |
| *B65D 83/28* | (2006.01) |
| *H01L 21/677* | (2006.01) |

(52) U.S. Cl.
CPC ................ *B65G 1/02* (2013.01); *B65D 83/28* (2013.01); *H01L 21/67359* (2013.01); *H01L 21/67393* (2013.01); *H01L 21/67769* (2013.01)

(58) Field of Classification Search
CPC .......... B65G 1/02; B65G 1/0492; B65G 1/06; B65D 83/28; H01L 21/67769; H01L 21/67359; H01L 21/67393
See application file for complete search history.

(56) References Cited

U.S. PATENT DOCUMENTS

| | | | |
|---|---|---|---|
| 8,942,844 B2 * | 1/2015 | Takahara | B65G 1/06 700/213 |
| 9,064,918 B2 * | 6/2015 | Takahara | H01L 21/67769 |
| 9,064,921 B2 * | 6/2015 | Shin | H01L 21/67772 |
| 9,199,793 B2 * | 12/2015 | Takahara | B65G 1/16 |
| 9,230,845 B2 * | 1/2016 | Otsuka | A47F 10/00 |
| 9,245,781 B2 * | 1/2016 | Takahara | H01L 21/67393 |
| 9,266,629 B2 * | 2/2016 | Takahara | B65B 5/00 |
| 9,457,955 B2 * | 10/2016 | Omori | B65G 1/02 |

(Continued)

FOREIGN PATENT DOCUMENTS

| | | |
|---|---|---|
| JP | 2013133193 A | 7/2013 |
| JP | 2016219537 A | 12/2016 |
| JP | 201750518 A | 3/2017 |

*Primary Examiner* — Nicolas A Arnett
(74) *Attorney, Agent, or Firm* — The Webb Law Firm

(57) ABSTRACT

A storage rack includes a plurality of storage portions each configured to store a container. The container has a supported portion and an intake portion in a bottom surface of the container, the intake portion supplying gas into the container, wherein the center of gravity of the container is located between the supported portion and the intake portion as seen along a vertical direction. Provided to each of the storage portions are a container support in which a support surface is formed for supporting the supported portion from below, a nozzle configured to contact the intake portion from below to supply gas into the container through the intake portion, and a restriction member configured to contact a side surface of the container when stored on the storage portion to restrict movement of the container along a horizontal direction. The container is supported only by the support surface and the nozzle.

2 Claims, 5 Drawing Sheets

(56) References Cited

U.S. PATENT DOCUMENTS

| | | | | |
|---|---|---|---|---|
| 9,524,893 B2* | 12/2016 | Takahara | .......... | H01L 21/67769 |
| 9,595,461 B2* | 3/2017 | Takahara | ................ | F17C 13/02 |
| 9,679,795 B2* | 6/2017 | Otsuka | .............. | H01L 21/67769 |
| 10,006,894 B2* | 6/2018 | Abe | ........................... | G01F 1/28 |
| 2010/0294397 A1* | 11/2010 | Kishkovich | ............... | G03F 1/66 |
| | | | | 141/66 |
| 2014/0003893 A1 | 1/2014 | Takahara et al. | | |
| 2015/0000372 A1* | 1/2015 | Otsuka | ............... | G01N 33/0009 |
| | | | | 73/23.2 |
| 2016/0172223 A1* | 6/2016 | Murata | .................... | G03F 1/66 |
| | | | | 141/8 |

* cited by examiner

STORAGE RACK

CROSS-REFERENCE TO RELATED APPLICATION

This application claims priority to Japanese Patent Application No. 2017-065323 filed Mar. 29, 2017, the disclosure of which is hereby incorporated in its entirety by reference.

FIELD OF THE INVENTION

The present invention relates to a storage rack comprising a plurality of storage portions each configured to store a container.

BACKGROUND ART

An example of such a storage rack is described in JP Publication of Application No. 2013-133193 (Patent Document 1). Each storage portion in the storage rack of Patent Document 1 is provided with a receiving support member 10a which has three positioning projections 10b for supporting a container, and an eject nozzle 10i for supplying gas to inside the container. In addition, the three positioning projections 10b engage engaged members which are formed in the bottom of each container to support the container and also to restrict horizontal movement of the container. In addition, the eject nozzle comes in contact with an intake opening 51i of the container stored on a storage portion to allow the gas ejected from the eject nozzle is supplied to inside the container through the intake opening 51i.

SUMMARY OF THE INVENTION

However, in the storage rack of Patent Document 1, discrepancies among the heights of the three positioning projections 10b may be caused by a distortion in a receiving support member 10a, etc., which in turn causes the container stored on the storage portion to be tilted with respect to the eject nozzle and thus causing the intake opening 51i of the container to be out of proper contact with the eject nozzle 10i. This may lead to a situation where the gas ejected from the eject nozzle 10i is not properly supplied to inside the container through the intake opening 51i.

Thus, a storage rack is desired in which it is is relatively easy to properly supply gas to inside a container.

In light of above, a storage rack comprises: a plurality of storage portions each configured to store a container; wherein the container has a supported portion and an intake portion in a bottom surface of the container, the intake portion supplying gas into the container, wherein a center of gravity of the container is located between the supported portion and the intake portion as seen along a vertical direction, wherein provided to each of the plurality of storage portions are a container support in which a support surface is formed for supporting the supported portion of the container from below, a nozzle which is configured to come in contact with the intake portion from below to supply gas into the container through the intake portion, and a restriction member which is configured to come in contact with a side surface of the container when stored on the storage portion to restrict movement of the container along a horizontal direction, and wherein the container is supported only by the support surface and the nozzle.

With such an arrangement, since the nozzle comes in contact with the intake portion of the container stored on the storage portion, gas ejected from the nozzle can be supplied into the container through the intake portion. In addition, movement along a horizontal direction is restricted because the container stored on the storage portion comes in contact with the restriction member.

The container stored on the storage portion is supported only by the support surface and the nozzle of the container support, and the center of gravity of the container is located between the supported portion and the intake portion. This causes the intake portion of the container to be pressed against the nozzle by the weight of the container, causing the intake portion to be in sealing contact with the nozzle, which facilitates proper supplying of gas ejected from the nozzle into the container through the intake portion.

DETAILED DESCRIPTION OF EMBODIMENTS

1. Embodiment

Embodiments of a container storage facility including storage racks are described next with reference to the attached drawings.

Figure 1:
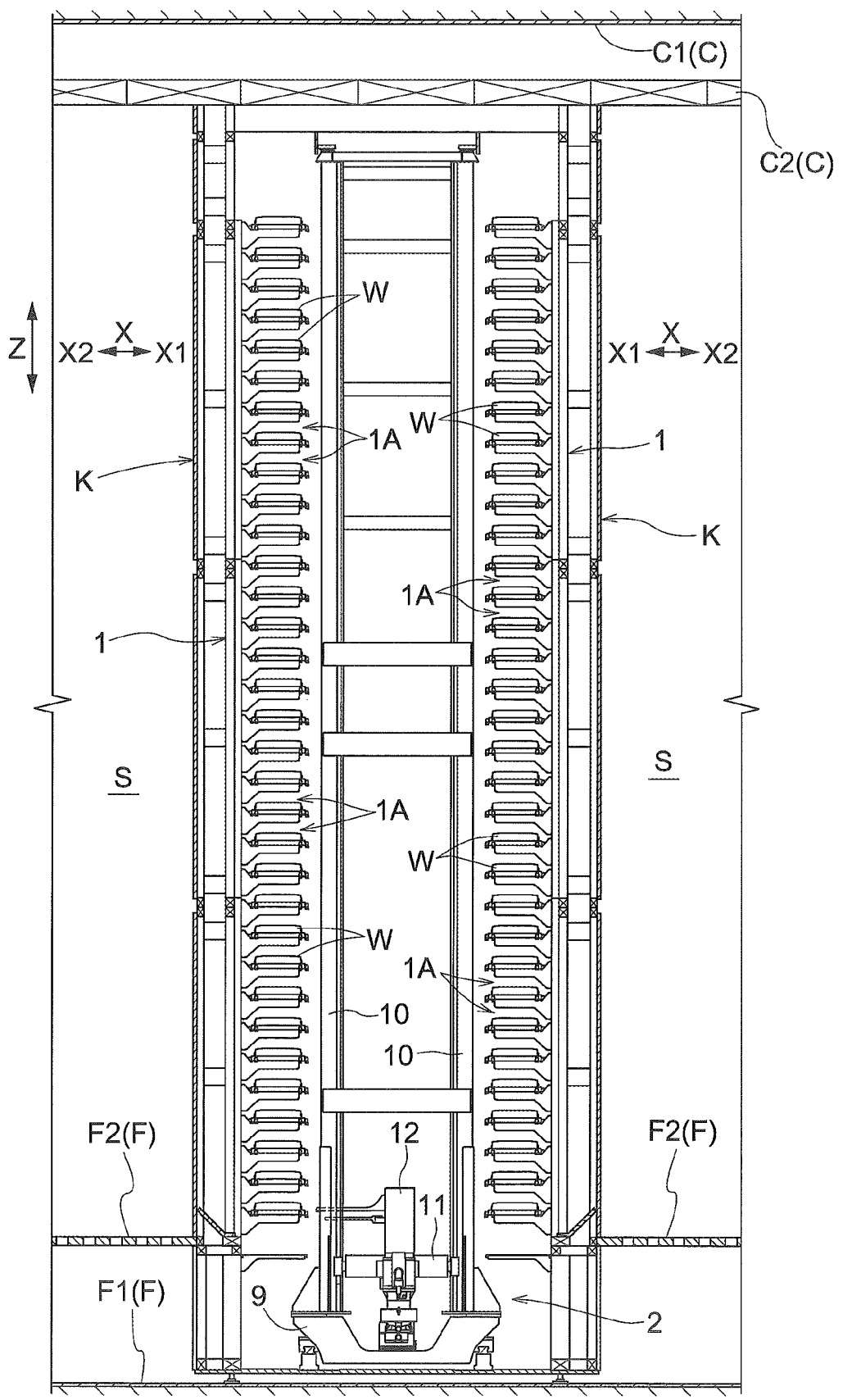
FIG. 1 is a side view of a container storage facility.

As shown in FIG. 1, a container storage facility includes storage racks 1 each comprising a plurality of storage portions 1A each configured to store a container W, a stacker crane 2 configured to transport containers W one container at a time, and walls K which cover the side perimeter of a space in which the storage racks 1 and the stacker crane 2 are installed.

Figure 2:
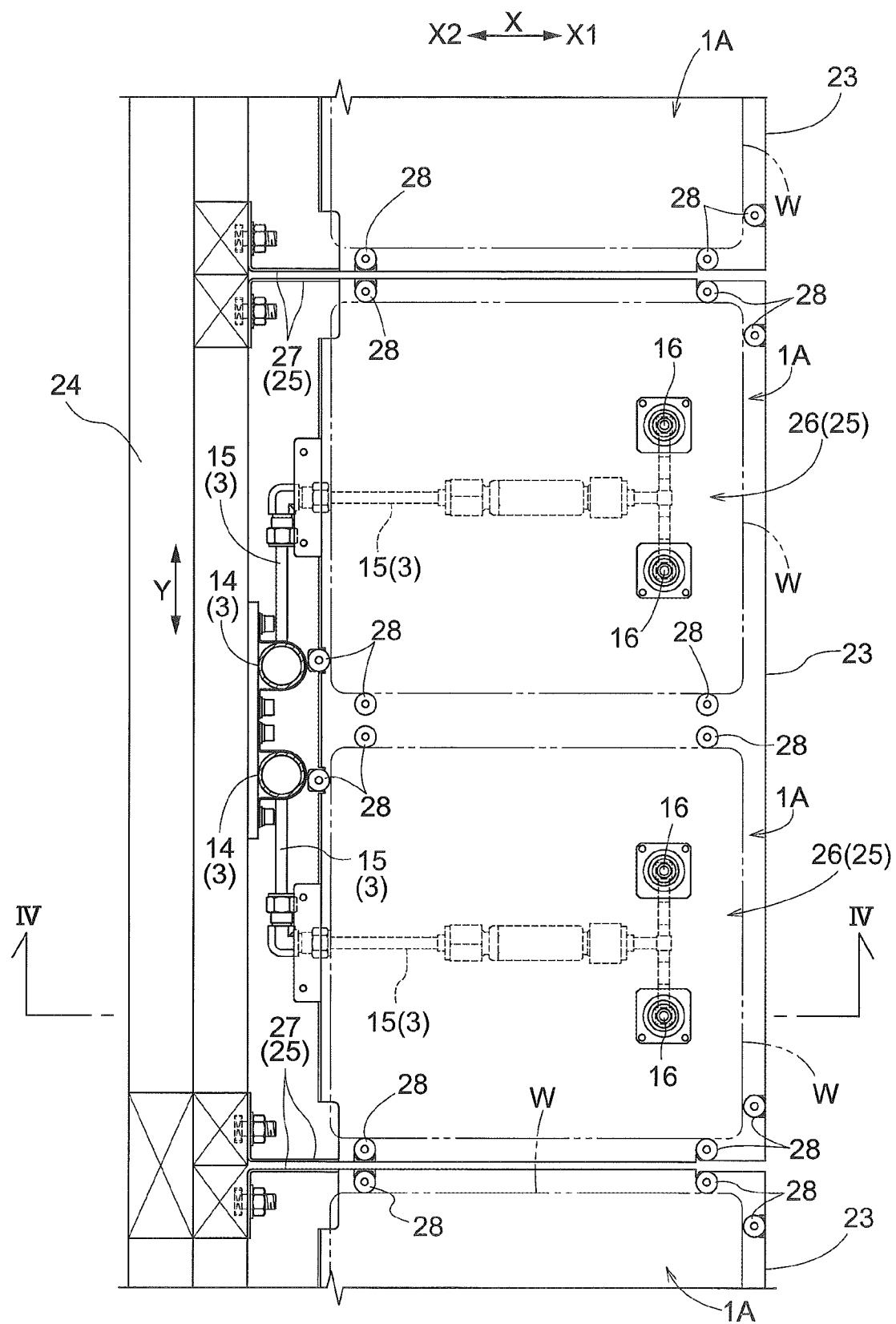
FIG. 2 is a plan view of storage portions.
Figure 3:
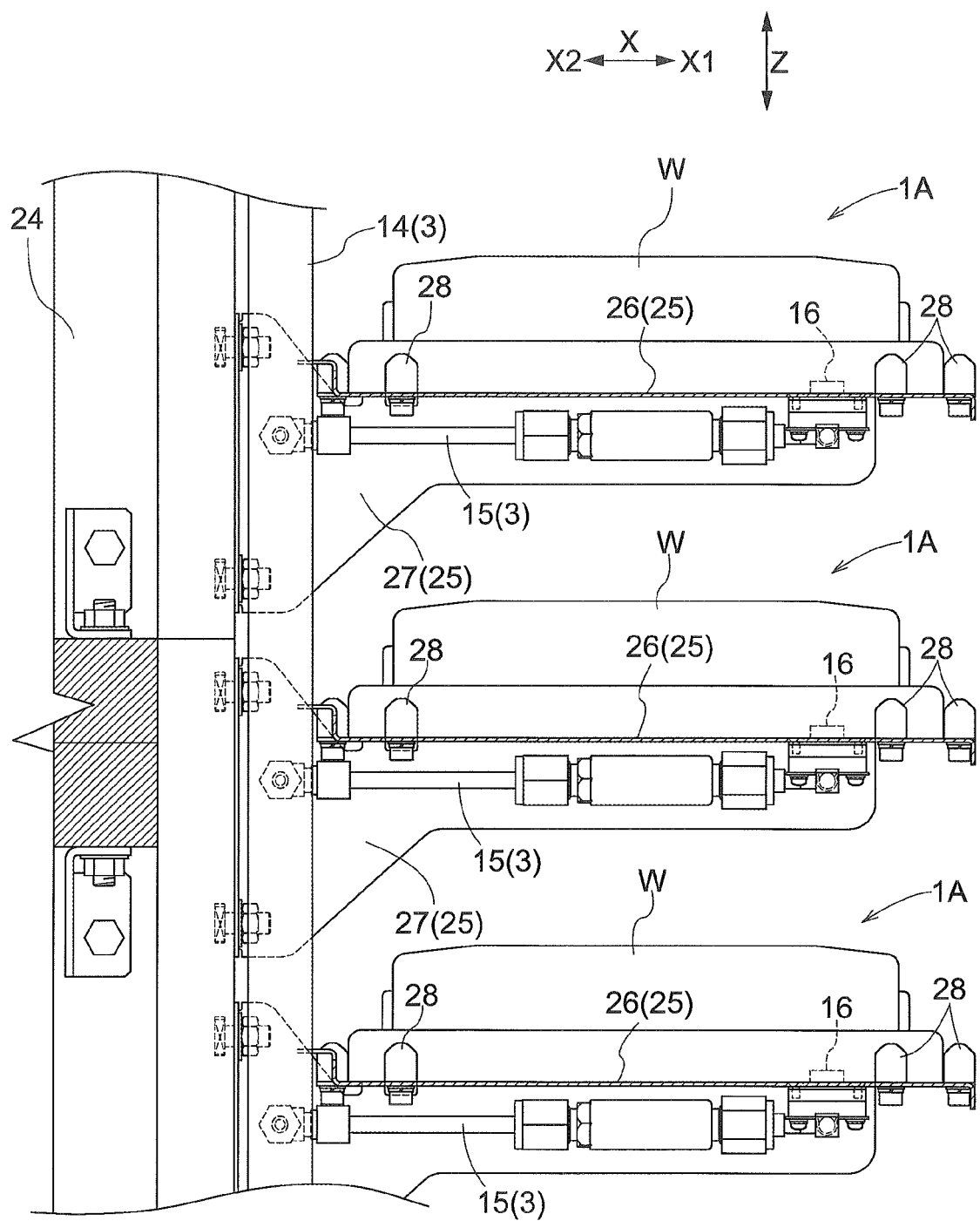
FIG. 3 is a side view of storage portions.

In addition, as shown in FIGS. 2 and 3, the container storage facility is provided with a gas supplying device 3. The gas supplying device 3 is configured to supply clean dry air (referred to hereafter simply as "dry air" for short), which is an example of gas, to inside the containers W stored on the storage portions 1A. In other words, the humidity of the gas supplied to inside the containers W by the gas supplying device 3 is lower than that of the gas around the storage portions 1A.

Each container W is configured to be capable of holding one substrate. In the present embodiment, the substrate is a reticle, and so each container W is a container W for holding a reticle.

As shown in FIG. 1, the article storage facility is installed in a clean room S of a down-flow type in which gas is caused to flow from a ceiling portion C toward a floor portion F.

The floor portion F of the clean room S includes a lower floor portion F1 and an upper floor portion F2 installed above the lower floor portion F1. The lower floor portion F1 is a floor with no ventilating holes and thus is one through which gas cannot move while the upper floor portion F2 is a floor with ventilating holes and thus is one through which gas can move along a vertical direction Z.

The ceiling portion C of the clean room S includes an upper ceiling portion C1, and a lower ceiling portion C2 located below the upper ceiling portion C1. The upper ceiling portion C1 is a ceiling with no ventilating holes and thus is one through which gas cannot move while the lower ceiling portion C2 is a ceiling with ventilating holes and thus is one through which gas can move along the vertical direction Z.

By ejecting air between the upper ceiling portion C1 and the lower ceiling portion C2 through operation of a blower (not shown), air (clean air) cleaned by a filter provided in the lower ceiling portion C2 is discharged into the clean room S, flows downward through the clean room S from the ceiling portion C toward the floor portion F, and subsequently flows through the upper floor portion F2 to the space between the lower floor portion F1 and the upper floor portion F2.

In the following description of the structure of each container W and the article storage facility is described, a direction along which each storage rack 1 and the stacker crane 2 is spaced apart from each other as seen along a vertical direction Z will be referred to as a front and backward direction X whereas a direction perpendicular to the front and backward direction X as seen along a vertical direction Z will be referred to as a lateral width direction Y. In addition, along (i.e. parallel to) the front and backward direction X, the direction in which the stacker crane 2 exists with respect to a given storage rack 1 will be referred to as a forward direction X1 (or simply "forward" when appropriate) for that storage rack 1 whereas the direction opposite to the forward direction X1 will be referred to as a backward direction X2 (or simply "backward" when appropriate) for that storage rack 1. In addition, with respect to directions associated with each container W, the front and backward direction X and the lateral width direction Y are defined as respective directions as defined when the container W is stored on a storage portion 1A.

Note that the front and backward direction X is, or corresponds to, a spaced-apart direction which is a horizontal direction that is parallel to a direction along which a support portion 25B is spaced apart from the nozzles 16. In addition, the forward direction X1 corresponds to a first side which is a side along (i.e., parallel to) the front and backward direction X on which the nozzles 16 are located with respect to the support portion 25B whereas a backward direction X2 corresponds to a second side which is the side opposite from the first side.

[Container]

Figure 4:
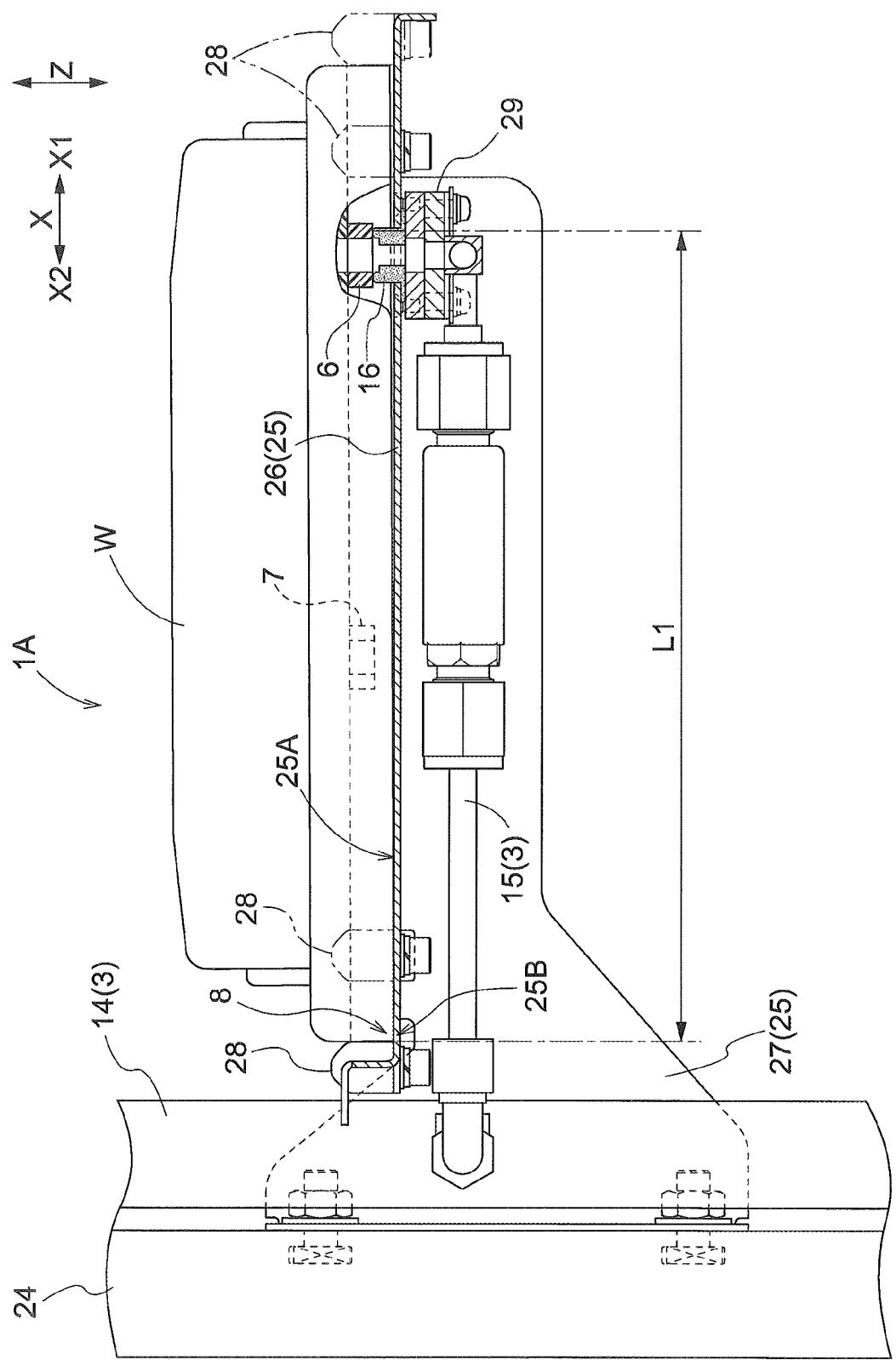
FIG. 4 is a side view of a container support and a nozzle.

As shown in FIG. 4, provided to a downward-facing bottom surface of each container W are intake portions 6, outlet portions 7 and a supported portion 8. When an intake portion 6 is described to be "provided to" a surface, this means that the intake portion 6 is either provided on the surface or provided to extend through the surface.

The intake portions 6 are portions each of which is configured to be capable of supplying dry air ejected from the corresponding one of the nozzles 16 of the gas supplying device 3 to inside the container W. Each intake portion 6 is provided with an intake opening and closing valve (e.g., an on-off valve, not shown). A pair of intake portions 6 are provided such that these intake portions 6 of the pair are spaced apart from each other along the lateral width direction Y, and such that they are located at the same position along the front and backward direction X.

The outlet portions 7 are portions each of which is configured to be capable of releasing the gas inside the container W to the outside of the container W. Each outlet portion 7 is provided with an outlet opening and closing valve (e.g., an on-off valve, not shown). A pair of outlet portions 7 are provided such that these outlet portions 7 of the pair are spaced apart from each other along the lateral width direction Y, and such that they are located at the same position along the front and backward direction X.

Both of the intake portions 6 of the pair are located forward X1 of the center of gravity of the container W whereas both of the outlet portions 7 of the pair are located backward X2 of the center of gravity of the container W along the front and backward direction X; therefore, the center of gravity of the container W is located between the intake portions 6 and the outlet portions 7 along the front and backward direction X. In addition, along the lateral width direction Y, the center of gravity of the container W is located between the intake portions 6 of the pair and between the outlet portions 7 of the pair. Note that the center of gravity of each container W is located between the intake portions 6 and the outlet portions 7 along the front and back direction X regardless of whether a substrate is held in the container W.

The intake opening and closing valve of each intake portion 6 is urged toward its closed state or position by an urging member, such as a coil spring. When dry air is ejected from a corresponding nozzle 16 of the gas supplying device 3 with the nozzle 16 in contact with the intake portion 6 from below, the intake opening and closing valve is opened by the pressure of the ejected dry air, allowing the dry air to be supplied to inside the container W through the intake portion 6. Similarly, the intake opening and closing valve of each outlet portion 7 is urged toward its closed state or position by an urging member, such as a coil spring. When the pressure inside the container W increases as a result of the dry air being supplied by the gas supplying device 3, the pressure causes the outlet opening and closing valve to be opened, allowing gas inside the container W to be released through the outlet portion 7.

A supported portion 8 is a portion (of a container W) that is supported from below by a support surface 25A of a container support 25 of the storage portion 1A when the container W is stored on a storage portion 1A. The supported portion 8 is located at a rearward end of the downward-facing bottom surface of the container W; so, the supported portion 8 is located rearward X2 (along the front and back direction X) of the center of gravity of the container W. In addition, the supported portion 8 is located in the same position as the center of gravity of the container W along the lateral width direction Y.

As such, the center of gravity of each container W is located between the intake portions 6 of a pair on one hand and the supported portion 8 on the other hand along the front and back direction X. At least a portion of the supported portion 8 is located between the intake portions 6 of the pair along the lateral width direction Y.

[Stacker Crane]

As shown in FIG. 1, the stacker crane 2 has a travel carriage 9 configured to travel along a travel direction (along (i.e., parallel to) the lateral width direction Y) and forward X1 of each storage rack 1 (i.e., between the two storage racks 2), a mast 10 arranged vertically on the travel carriage 9, a vertically movable member 11 configured to be vertically moved along the mast 10, and a transfer device 12 mounted on, and supported by, the vertically movable member 11.

The transfer device 12 is moved along the lateral width direction Y as a result of the traveling of the travel carriage 9, and along the vertical direction X as a result of the vertical movement of the vertically movable member 11. Although a detailed description is omitted here, the transfer device 12 has a support platform for supporting a container W, and a mechanism (such as a slide-out mechanism with a pair of elongate members that can be linearly moved with respect to another pair of elongate members) capable of moving the support platform along the front and back direction X; thus, the transfer device 12 is configured to be capable of transferring a container W to and from any of the storage portions 1A.

[Gas supplying Device]

As shown in FIGS. 2 and 3, the gas supplying device 3 includes a primary pipe (not shown) connected to a gas supply source (not shown), a plurality of vertical pipes 14 each of which branches out from the primary pipe, and a plurality of branch pipes 15 each of which branches out from the corresponding vertical pipe 14. Dry air from the gas supply source flows through the primary pipe, a vertical pipe 14, and a branch pipe 15, in that order, and is finally ejected from the nozzles 16 provided in each storage portion 1A.

The primary pipe is provided, for example, at a height below the lowest horizontal row of storage portions 1A, and extends along the lateral width direction Y. Each of the plurality of vertical pipes 14 is arranged to extend upward from the primary pipe. Each of the plurality of branch pipes 15 is arranged to extend from a vertical pipe 14 in the lateral width direction Y and along the front and back direction X. Nozzles 16 are connected to each branch pipe 15 at the distal end thereof.

Figure 5:
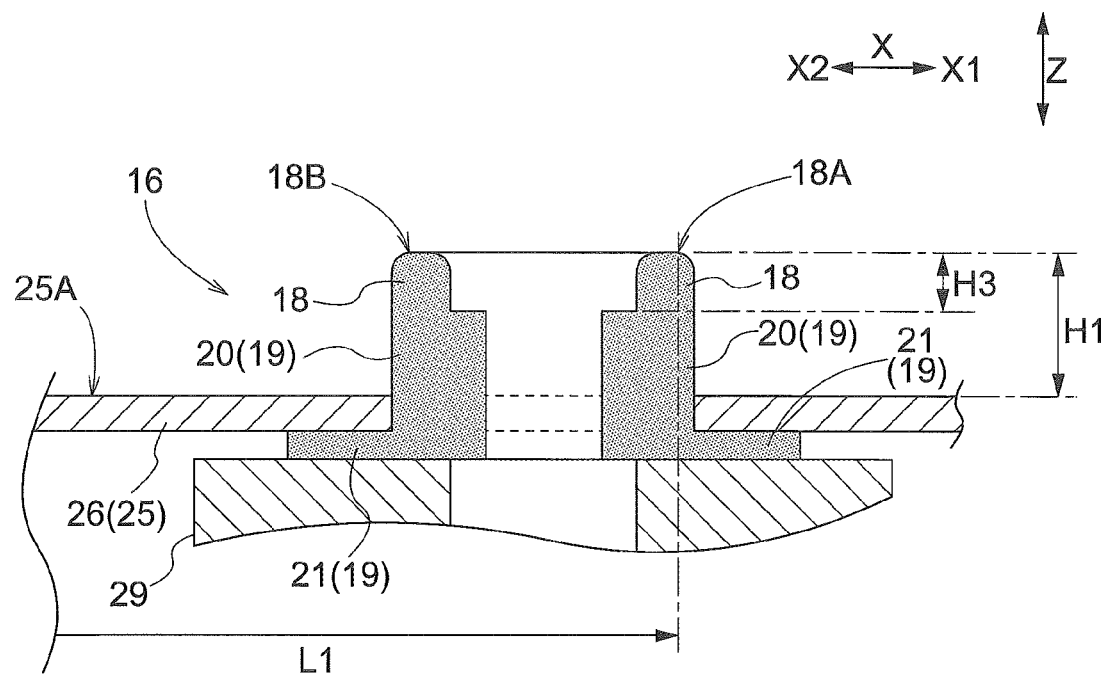
FIG. 5 shows a nozzle in a natural state.

As shown in FIG. 5, each nozzle 16 has a generally cylindrical distal end portion 18, and a generally cylindrical base portion 19 located below the distal end portion 18. The base portion 19 is fixed to a container support 25 of the corresponding storage portion 1A. The distal end portion 18 come in contact with the corresponding intake portion 6 of a container W stored on the storage portion 1A from below.

The base portion 19 has a first base portion 20 connected to the distal end portion 18, and a second base portion 21 located at the bottom of the nozzle 16.

Each of the distal end portion 18 and the base portion 19 is made of, or from, elastically deformable material (for example, synthetic rubber). In addition, the distal end portion 18 and the base portion 19 are formed integrally into one piece. The distal end portion 18 and the base portion 19 are made of the same material.

The distal end portion 18 and the first base portion 20 have the same outer diameter whereas the second base portion 21 has an outer diameter greater than that of the distal end portion 18 and the first base portion 20. In addition, the first base portion 20 and the second base portion 21 have the same inner diameter whereas the distal end portion 18 has an inner diameter greater than that of the first base portion 20 and the second base portion 21. Thus, the thickness of the distal end portion 18 in a radial direction is smaller than the thickness of the base portion 19 (the first base portion 20 and the second base portion 21) in the radial direction. Since the thickness of the distal end portion 18 in a radial direction is less than the thickness of the base portion 19 in the radial direction, the distal end portion 18 can be elastically deformed more easily compared with the base portion 19. In addition, at least a portion of the distal end portion 18 is formed in such a shape that its thickness in the radial direction decreases toward its top.

[Storage Rack]

As shown in FIG. 1, a pair of storage racks 1 are installed such that they face each other. Each of the storage racks 1 of the pair has storage portions 1A located one above another along the vertical direction Z, and one next to another along the lateral width direction Y. The storage racks 1 forming the pair has a similar or identical structure except for their different orientations.

As shown in FIGS. 2 and 3, each storage rack 1 has a plurality of shelf members 23 each for supporting, from below, containers W stored on corresponding storage portions 1A, and rack frame members 24 each of which supports a plurality of shelf members 23 in a cantilever fashion (i.e., each rack frame member 24 that supports a shelf member 23 is located on one side of the shelf member 23).

The storage rack 1 has a plurality of shelf members 23 located one above another along the vertical direction Z and one next to another along the lateral width direction Y. One shelf member 23 is installed for two storage portions 1A that are adjacent each other along the lateral width direction Y. The dimension of each shelf member 23 along the lateral width direction Y is set to allow the shelf member 23 to support two containers that are placed adjacent each other along the lateral width direction Y so that two container supports 25 are formed by each shelf member 23.

Each container support 25 has a support plate 26 for supporting, from below, a container W stored on the corresponding storage portion 1A, and a connecting member 27 connected to a rack frame member 24. Each support plate 26 is generally formed to be flat and thin (i.e., width and length being greater than thickness) and extends along the front and back direction X and the lateral width direction Y. The support surface 25A that supports a supported portion 8 of a container W from below is formed in, and by, an upward facing surface of a support plate 26.

Each container support 25 supports a plurality of restriction members 28 and a pair of nozzles 16.

The plurality of restriction members 28 are fixed to the container support 25 such that the restriction members 28 project upward from, or with respect to, the support surface 25A of the container support 25. In addition, the plurality of restriction members 28 are located such that one or more restriction members 28 are located on each side of a stored container W along the front and back direction X as well as each side of the stored container W along the lateral width direction Y, and such that the plurality of restriction members 28 do not overlap with the container W stored on the storage portion 1A, as seen along the vertical direction Z. Movement of a stored container W along the front and back direction X and along the lateral width direction Y is restricted as a result of its side surfaces being in, or coming into, contact with the restriction members 28.

The pair of nozzles 16 are fixed to the container support 25 such that the nozzles 16 project upward from, or with respect to, the support surface 25A of the container support 25. The nozzles 16 are so located that each nozzle 16 overlaps with the corresponding intake portions 6 of a container W stored on the storage portion 1A, as seen along the vertical direction Z. In other words, when a container W is stored on a storage portion 1A, the nozzles 16 come into contact with the intake portions 6 of the container W from below, causing the nozzles 16 to be connected to the intake portions 6. As dry air is ejected from the nozzles 16 with the nozzles 16 in contact with the intake portions 6, the dry air is supplied to inside the container W through the intake portions 6 and gas inside the container W is released from the outlet portions 7.

How the nozzles 16 are fixed to the container support 25 is described in more detail. Each container support 25 is provided with fasteners 29 each for fixing an end of a branch pipe 15 to the container support 25. Each fastener 29 (which may be bolts and a metal plate with a through hole to act as a gas conduit and holes for the bolts) is connected to the bottom surface of the support plate 26. Each nozzle 16 is fixed to the container support 25 with its second base portion 21 held between the container support 25 and a fastener 29 along the vertical direction Z. The entire distal end portion 18 and a part of its first base portion 20 of each nozzle 16 are located above the support surface 25A.

As shown in FIG. 5, with a first end portion 18A being defined to be a forward X1 end portion of a contact area (of the distal end portion 18a) that comes into contact with the container W and with a second end portion 18B being defined to be a backward X2 end portion of the contact area, the first end portion 18A and the second end portion 18B are located at the same height when the nozzle 16 is in its natural state (i.e., when the nozzle 16 is not supporting any member such as a portion of a container).

As a result of the nozzles 16 and the restriction members 28 being supported by each of a plurality of container support 25, each of a plurality of storage portions 1A include a container support 25 in which a support surface 25A is formed to support a supported portion 8 of a container W from below, nozzles 16 configured to come in contact with the corresponding intake portions 6 from below to supply gas to the inside of the container W through the intake portions 16, and restriction members 28 each of which is configured to come in contact with a side surface of the container stored on the storage portion 1A to restrict movement of the container W along a horizontal direction.

Only the supported portion 8 of a container W stored on a storage portion 1A is in contact with the support surface 25A. In other words, a container W stored on a storage portion 1A is supported as a result of the supported portion 8 coming in contact with a support portion 25B of the support surface 25A and the intake portions 6 coming in contact with the nozzles 16; thus, the container W is supported only by the support surface 25A and the nozzles 16.

Figure 6:
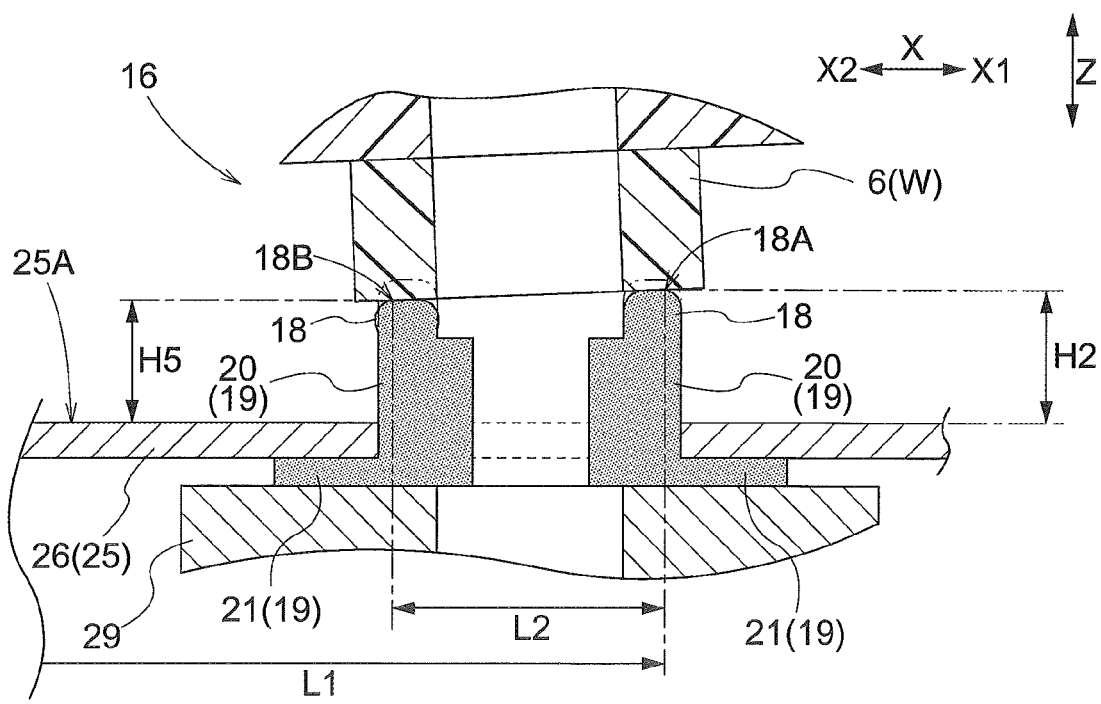
FIG. 6 shows the nozzle when supporting a container.

As shown in FIGS. 5 and 6, when a container W is stored on a storage portion 1A and the container W is supported only by the support surface 25A and the nozzles 16, the nozzles 16 are compressed downward under the weight of the container W; thus, their vertical length are shortened. Therefore, a second vertical distance H2 is less than a first vertical distance H1 where the first vertical distance H1 is a distance along the vertical direction Z from the support surface 25A to the upper end of a distal end portion 18 in the natural state and the second vertical distance H2 is a distance along the vertical direction Z from the support surface 25A to the upper end of a distal end portion 18 of a nozzle in a supporting state (i.e., when supporting an article).

A container W supported only by the support surface 25A and the nozzles 16 would be in a tilted attitude in which its forward X1 portion is raised compared with a reference attitude where the reference attitude is the attitude of the container W when it is supported on a horizontal surface. The first end portion 18A of each nozzle 16 becomes the upper end of the nozzle 16 in a supporting state in which the nozzle 16 is supporting a container W (i.e., receiving a part of the weight of the container W). In other words, the second vertical distances H2 is a distance, along the vertical direction Z, from the support surface 25A to the first end portion 18A of a nozzle 16 in the supporting state.

In addition, since the container W would be in a tilted attitude as described above, the second end portion 18B side of each nozzle 16 is compressed downward to a greater extent than the first end portion 18A side. Therefore, a fifth vertical distance H5 is less than a second vertical distance H2 where the fifth vertical distance H5 is a distance along the vertical direction Z from the support surface 25A to the second end portion 18B of a nozzle in the supporting state.

Let us define a first horizontal distance L1 to be a distance along the front and back direction X from the support portion 25B to a first end portion 18A, a second horizontal distance L2 to be a distance along the front and back direction X from the first end portion 18A to a second end portion 18B, and a third vertical distance H3 to be a distance along the vertical direction Z from the upper end of a distal end portion 18 to its lower end in a natural (un-supporting) state.

Then, the shape and dimensions of each nozzle 16 and the elastic modulus of the material or materials the nozzles 16 are made of or from are set or selected such that the third vertical distance H3 is greater than a fourth vertical distance H4 expressed by $H4=(L2/L1) \times H2+(H1-H2)$. Thus, the third vertical distance H3 is greater than the amount of lowering of the second end portion 18B of a nozzle 16 when a container W is supported. Therefore when the container W is supported, the elastic deformation of the nozzle 16 can be absorbed only by the distal end portion 18.

2. Other Embodiments

Other embodiments of a storage rack is described next.

(1) In the embodiment described above, the distal end portion 18 and the base portion 19 of a nozzle 16 are formed integrally into one piece. However, the distal end portion 18 and the base portion 19 of a nozzle 16 may be formed as two separate members joined together. When the distal end portion 18 and the base portion 19 of a nozzle 16 are two members, the base portion 19 may be formed of metal, such as aluminum so that only the distal end portion 18 among the two portions of the nozzle 16 can be elastically deformed.

(2) In the embodiment described above, both of the distal end portion 18 and the base portion 19 of a nozzle 16 are formed to be generally cylindrical, and the thickness of the distal end portion 18 in a radial direction is less than the thickness of the base portion 19 in the radial direction. However, the shape of a nozzle 16 may be changed suitably. For example, the thickness of the distal end portion 18 in a radial direction may be the same as the thickness of the base portion 19 in the radial direction.

(3) In the embodiment described above, the third vertical distance H3 is set to be greater than the fourth vertical distance H4. Alternatively, for example, by forming or constructing the base portion 19 to be easily deformed elastically, the third vertical distances H3 may be set to be less than or equal to the fourth vertical distances H4.

(4) In the embodiment described above, the containers W are those for holding a reticle. However, the containers W may be other types of containers such as, for example, FOUPs for holding one or more semiconductor wafers. In addition, the gas supplied to inside the containers W is dry air in the embodiment described above. However, the gas supplied to inside the containers W may be gas (other than dry air) such as inert gas (e.g., nitrogen gas and/or gaseous argon).

(5) Note that any feature and arrangement disclosed in any one of the embodiments describe above may be used in combination with any feature and arrangement disclosed in any other embodiments described above unless such combination gives rise to a contradiction. Regarding any other arrangements and features, the embodiments disclosed in the present description are provided for the purposes of illustration only regarding all aspects. Therefore, it is possible to make various suitable changes without departing from the spirit of the present disclosure.

3. Summary of Embodiments Described Above

A brief summary of the storage rack described above is given next.

A storage rack comprises a plurality of storage portions each configured to store a container.

The container has a supported portion and an intake portion in a bottom surface of the container, the intake portion supplying gas into the container, wherein a center of gravity of the container is located between the supported portion and the intake portion as seen along a vertical direction, wherein provided to each of the plurality of storage portions are a container support in which a support surface is formed for supporting the supported portion of a container from below, a nozzle is configured to come in contact with the intake portion from below to supply gas to into the container through the intake portion, and a restriction member which is configured to come in contact with a side surface of the container when stored on the storage portion to restrict movement of the container along a horizontal direction, and wherein the container is supported only by the support surface and the nozzle.

With such an arrangement, since the nozzle comes in contact with the intake portion of the container stored on a storage portion, gas ejected from the nozzle can be supplied into the container through the intake portion. In addition, movement along the horizontal direction is restricted because the container stored on the storage portion comes in contact with the restriction member.

The container stored on the storage portion is supported only by the support surface and the nozzle of the container support. The center of gravity of the container is located between the supported portion and the intake portion. This causes the intake portion of the container to be pressed against the nozzle by the weight of the container, causing the intake portion to be in sealing contact with the nozzle, which facilitates proper supplying of gas ejected from the nozzle into the container through the intake portion.

It is preferable that the nozzle has a distal end portion configured to come in contact with the intake portion, the distal end portion configured to be elastically deformable.

With such an arrangement, the intake portion of the container is pressed against the nozzle by the weight of the container, which causes the distal end portion of the nozzle to be elastically deformed. This makes it easier for the distal end portion of the nozzle to be deformed into a shape that helps in having sealing contact with the intake portion, which facilitates proper supplying of gas ejected from the nozzle into the container through the intake portion.

In addition, it is preferable that the distal end portion is cylindrical, the nozzle further has a cylindrical base portion located below the distal end portion, and a thickness of the distal end portion in a radial direction is less than a thickness of the base portion in the radial direction.

With such an arrangement, since the thickness of the distal end portion in a radial direction is less than the thickness of the base portion in the radial direction, the distal end portion can be elastically deformed more easily compared with the base portion when the distal end portion and the base portion are formed of or from the same material. In other words, since the distal end portion can be elastically deformed relatively easily, the distal end portion of the nozzle can be easily deformed into a shape that helps in having sealing contact with the intake portion.

In addition, it is preferable that the distal end portion is cylindrical, the nozzle further has a cylindrical base portion located below the distal end portion, and the nozzle is fixed to the container support such that the nozzle projects upward with respect to the support surface, with a support portion being a portion of the support surface which comes in contact with the supported portion of the container when the container is supported by the support surface, a spaced-apart direction being a horizontal direction along which the support portion and the nozzle are spaced apart from each other, a first side being a side on which the nozzle is located with respect to the support portion along the spaced-apart direction and a second side being a side that is opposite from the first side along the spaced-apart direction, a first vertical distance H1 being a distance from the support surface to an upper end of the nozzle in a natural state along a vertical direction, a second vertical distance H2 being a distance, along a vertical direction, from the support surface to the upper end of the nozzle when supporting the container, a first horizontal distance L1 being a distance, along the spaced-apart direction, from the support portion to a first end portion which is an end portion, on the first side, of a contact area of the distal end portion which comes in contact with the container when supporting a container, a second horizontal distance L2 being a distance, along the spaced-apart direction, from the support portion to a second end portion which is an end portion of the contact area on the second side, and a third vertical distance H3 being a distance, along the vertical direction, from an upper end to a lower end of the distal end portion in a natural state, then the third vertical distances H3 is greater than a fourth vertical distance H4 expressed by $H4=(L2/L1) \times H2+(H1-H2)$.

With such an arrangement, the distal end portion of the nozzle would be vertically compressed and elastically deformed when supporting a container. As a result of the nozzle being elastically deformed, the container would be tilted such that the end portion on the first side is lowered compared to when the nozzle is not elastically deformed. Thus, for the nozzle which supports the container, the first end portion is lowered to a greater extent than the second end portion. The difference in the amount of lowering which is the difference between the amount of lowering of the first end portion of a nozzle and the amount of lowering of the second end portion of the nozzle is obtained by $(L2/L1) \times H2$. In addition, the amount of lowering of the first end portion is given by $H1-H2$. The amount of lowering of the second end portion of a nozzle in the natural state can be obtained by adding the amount of lowering of the first end portion to the difference in the amount of lowering described above.

The third vertical distance H3 which is the distance from the upper end to the lower end of the distal end portion in the natural state is greater than the amount of lowering of the second end portion which is the portion of the nozzle that is lowered to the greatest extent. By so arranging, although the nozzle may be vertically compressed and deformed elastically when supporting a container, the elastic deformation of the nozzle can be absorbed only by its distal end portion so that a container can be supported without changing the shape of the base portion of the nozzle, which makes it easier for the distal end portion of the nozzle to have a sealing contact with the intake portion.

INDUSTRIAL APPLICABILITY

The technology related to the present disclosure can be used as a storage rack comprising a plurality of storage portions each configured to store a container.

What is claimed is:

1. A storage rack comprising:

a plurality of storage portions each configured to store a container;

wherein the container has a supported portion and an intake portion in a bottom surface of the container, the intake portion supplying gas into the container, wherein:

a center of gravity of the container is located between the supported portion and the intake portion as seen along a vertical direction, provided to each of the plurality of storage portions are a container support in which a support surface is formed for supporting the supported portion of the container from below, a nozzle which is configured to come in contact with the intake portion from below to supply gas into the container through the intake portion, and a restriction member which is configured to come in contact with a side surface of the container when stored on the storage portion to restrict movement of the container along a horizontal direction, the container is supported only by the support surface and the nozzle, the nozzle is fixed to the container support such that the nozzle projects upward with respect to the support surface, the nozzle has a distal end portion configured to come in contact with the intake portion, the distal end portion configured to be elastically deformable, the distal end portion is cylindrical, the nozzle further has a cylindrical base portion located below the distal end portion, with a support portion being a portion of the support surface which comes in contact with the supported portion of the container when the container is supported by the support surface, a spaced-apart direction being a horizontal direction along which the support portion and the nozzle are spaced apart from each other, a first side being a side on which the nozzle is located with respect to the support portion along the spaced-apart direction and a second side being a side that is opposite from the first side along the spaced-apart direction, a first vertical distance $H1$ being a distance from the support surface to an upper end of the nozzle in a natural state along a vertical direction, a second vertical distance $H2$ being a distance, along a vertical direction, from the support surface to the upper end of the nozzle when supporting the container, a first horizontal distance $L1$ being a distance, along the spaced-apart direction, from the support portion to a first end portion which is an end portion, on the first side, of a contact area of the distal end portion which comes in contact with the container when supporting a container, a second horizontal distance $L2$ being a distance, along the spaced-apart direction, from the support portion to a second end portion which is an end portion of the contact area on the second side, and a third vertical distance $H3$ being a distance, along the vertical direction, from an upper end to a lower end of the distal end portion in a natural state, then the third vertical distances $H3$ is greater than a fourth vertical distance $H4$ expressed by $H4=(L2/L1)\times H2+(H1-H2)$.

2. The storage rack as defined in claim 1, wherein: a thickness of the distal end portion in a radial direction is less than a thickness of the base portion in the radial direction.

* * * * *